(12) United States Patent
Tabatabai et al.

(10) Patent No.: US 8,669,646 B2
(45) Date of Patent: Mar. 11, 2014

(54) APPARATUS AND METHOD FOR GROUNDING AN IC PACKAGE LID FOR EMI REDUCTION

(75) Inventors: Mohammad Tabatabai, Newport Beach, CA (US); Abbas Amirichimeh, Irvine, CA (US); Lorenzo Longo, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/149,793

(22) Filed: May 31, 2011

(65) Prior Publication Data

US 2012/0306061 A1 Dec. 6, 2012

(51) Int. Cl.
*H01L 23/552* (2006.01)
*H01L 21/00* (2006.01)

(52) U.S. Cl.
USPC ........... 257/659; 257/675; 257/676; 257/707; 257/E21.599; 257/E23.01; 257/E23.037; 257/E23.114; 361/783; 361/816; 438/110; 438/113

(58) Field of Classification Search
USPC .................. 257/659, 675, 676, 707, E21.599, 257/E23.01, E23.037, E23.114; 361/783, 361/816; 438/110, 113
See application file for complete search history.

(56) References Cited

U.S. PATENT DOCUMENTS

| | | | | |
|---|---|---|---|---|
| 5,977,626 A | * | 11/1999 | Wang et al. | 257/707 |
| 6,740,959 B2 | * | 5/2004 | Alcoe et al. | 257/659 |
| 6,891,732 B2 | * | 5/2005 | Takano et al. | 361/783 |
| 7,629,674 B1 | * | 12/2009 | Foster | 257/659 |
| 8,062,930 B1 | * | 11/2011 | Shah et al. | 438/110 |
| 8,183,680 B2 | * | 5/2012 | Zhao et al. | 257/687 |
| 2002/0084524 A1 | * | 7/2002 | Roh et al. | 257/738 |
| 2007/0200210 A1 | * | 8/2007 | Zhao et al. | 257/676 |
| 2009/0002967 A1 | * | 1/2009 | Asami | 361/816 |
| 2009/0085185 A1 | * | 4/2009 | Byun et al. | 257/686 |
| 2011/0248389 A1 | * | 10/2011 | Yorita et al. | 257/659 |

* cited by examiner

*Primary Examiner* — Dao H Hguyen
(74) *Attorney, Agent, or Firm* — Sterne, Kessler, Goldstein & Fox P.L.L.C.

(57) ABSTRACT

Methods and apparatus for improved electromagnetic interference (EMI) shielding and thermal performance in integrated circuit (IC) packages are described. A die-up or die-down package includes a protective lid, a plurality of ground posts, an IC die, and a substrate. The substrate includes a plurality of ground planes. The IC die is mounted to the substrate. Plurality of ground posts is coupled to plurality of ground planes that surround IC die. Protective lid is coupled to plurality of ground posts. The plurality of ground posts and the protective lid from an enclosure structure that substantially encloses the IC die, and shields EMI from and radiating towards the IC die. The enclosure structure also dissipates heat generated by the IC die during operation.

25 Claims, 11 Drawing Sheets

APPARATUS AND METHOD FOR GROUNDING AN IC PACKAGE LID FOR EMI REDUCTION

BACKGROUND OF THE INVENTION

1. Field of the Invention

The invention relates generally to the field of integrated circuit (IC) device packaging technology and, more particularly to electromagnetic interference (EMI) shielding and thermal relief enhancement in IC device packages.

2. Background

Integrated circuit semiconductor chips or dies are typically mounted in or on a package that is attached to a printed circuit board (PCB). IC device packages act as a carrier for the IC die and as an interconnection mechanism between the die and the electrical circuits of the PCB. IC device packages emit radiation emissions that may be broadband or monotonic related. Such emissions may be radiated by the package top or lid of the IC device package. The package top of the IC device inclusive of any internal or external heat-slug/heat-spreader that is not grounded acts as an antenna and transmits the radiation emissions generated by the IC device package negatively affecting the performance of other electronic systems susceptible to the radiation emissions. The IC device package itself may also be susceptible to radiation emissions generated by other electronic systems.

Commercially available IC device packages have poor thermal performance and EMI shielding. Thus, what is needed is reduced EMI susceptibility and emission in combination with improved thermal and electrical performances, in integrated circuit device packages.

BRIEF SUMMARY OF THE INVENTION

The present invention is directed to methods and apparatus for improved EMI shielding and thermal performance in IC packages.

In an aspect of the present invention, an IC device package includes an IC die, a heat spreader cap ("package lid"), a plurality of ground posts, and a substrate. The substrate has a first surface and a second surface and includes a plurality of ground planes. The IC die is attached to the first surface of the substrate. The plurality of ground posts are mounted to the substrate and coupled to each corresponding ground plane, of the plurality of ground planes. The package lid coupled to the plurality of ground posts.

In another aspect of the present invention, an IC device package is assembled. A substrate having a plurality of ground planes is formed. At least one IC die is attached to a first surface of the substrate. A plurality of ground posts are mounted to the first surface of the substrate. The plurality of ground posts are coupled to the plurality of ground planes. A package lid is coupled to the plurality of ground posts.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
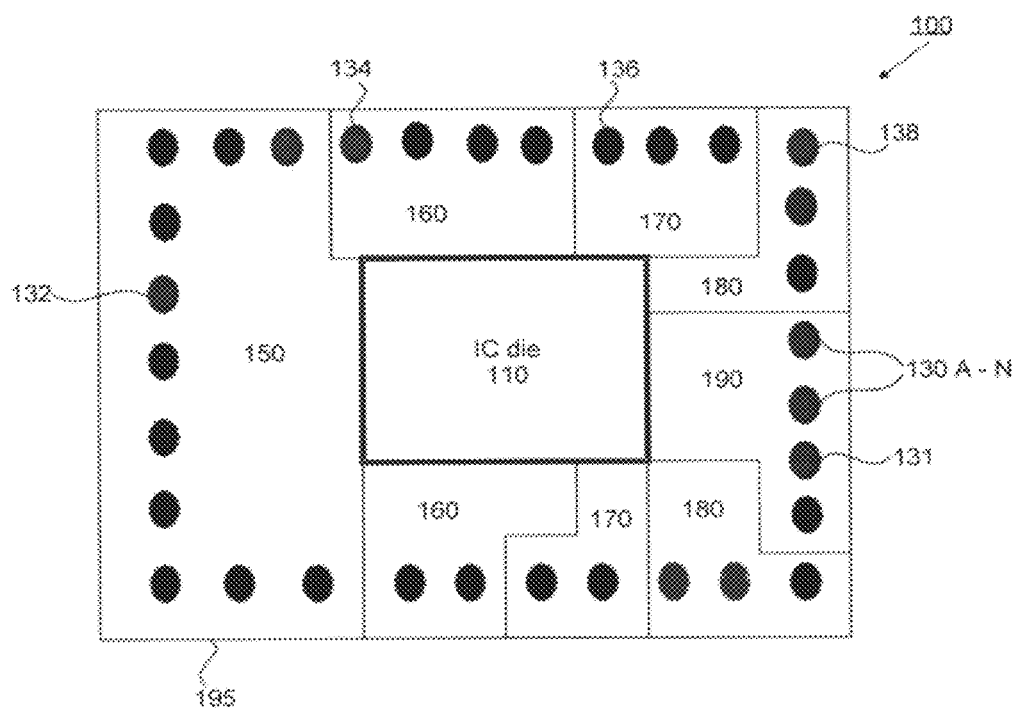
FIG. 1 illustrates a typical IC package design with ground planes exposed to the surface of the substrate by using solder-mask defined openings.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to methods and apparatuses for integrated circuit (IC) packages with respect to improving electromagnetic interference (EMI) shielding performance, thermal performance and/or enhancement of environmental protection. In embodiments of the invention, an IC die is mounted to a substrate. In an embodiment, the package is configured in a die-up configuration. In another embodiment, the package is configured in a die-down configuration.

In embodiments of the invention, metal heat spreaders ("package lid") are coupled (e.g. electrically, structurally, and/or thermally connected) to ground posts. The ground posts are comprised of a conductive material and are coupled to ground planes located in the substrate. The coupling of the package lid to the ground posts and the coupling of the ground posts to the ground planes located in or on the substrate form an enclosure structure. In an embodiment, the ground posts may be coupled to an upper level layer of a multi-layer substrate. The ground posts may also be coupled to lower layers of a multi-layer substrate. In an embodiment, the coupling may be affected with or without the use of a thermally and/or electrically conductive adhesive, such as solder or epoxy with metal particles or flakes.

The enclosure structure formed by the package lid and the ground posts approximate an equipotential surface, or Faraday Cage, surrounding the die and corresponding interconnections. In an embodiment, the enclosure structure material is also a very good conductor of heat and is relatively rigid (e.g., copper or copper alloy such as C194, C151, C7025, or EFTEC/64T). The enclosure structure improves EMI shielding.

In an embodiment, the die is encapsulated in an encapsulating material, such as a molding compound, which provides environmental protection. The encapsulating material may also completely cover the package lid and ground posts. In other embodiments, the package lid and ground posts are partially covered, or are not covered by the encapsulating material.

In an embodiment of the invention, the package lid is coupled with an external heat sink, to further enhance the thermal performance of the package.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Example Integrated Circuit Packages

FIG. 1 shows a conventional IC package design. An IC die 110 is attached to a substrate 195. Substrate 195 includes ground plane 150, ground plane 160, ground plane 170, ground plane 180 and ground plane 190. Substrate 195 further includes a plurality of solder-mask openings 130 A-N that include solder-mask opening 131, 132, 134, 136, and 138.

IC die 110 is attached with thermally or conductive adhesive to substrate 195. IC die 110 may also be a flip-chip attached to substrate 195 without the use of any kind of epoxy. Ground planes 150, 160, 170, 180, and 190 are included in substrate 195 and encompassed within substrate 195. As would be appreciated by one having ordinary skill in the relevant art, given the description herein, each of the ground planes 150, 160, 170, 180, and 190 is comprised of a layer of copper that appears to most signals as an infinite ground potential. Each of the ground planes 150, 160, 170, 180, and 190 aids in the reduction of noise and also aids in ensuring that IC package 100 compares different signal voltages to the same reference potential. Each ground plane 150, 160, 170, 180, and 190 also aids in circuit design in allowing the designer to ground components directly to the ground plane.

Substrate 195 also includes a plurality of solder-mask openings 130 A-N, where N is an integer greater than 1. As would be appreciated by one having ordinary skill in the relevant art, given the description herein, substrate 195 may be coated or laminated with a layer of dielectric material (e.g., solder mask, dielectric film, etc.) that is a layer of polymer that provides permanent protective coating for the copper traces of a printed circuit board and prevents solder from bridging between conductors in preventing short circuits.

A solder-mask encompasses substrate 195. Plurality of solder-mask openings 130 A-N includes a plurality of openings in the solder-mask that encompasses substrate 195 where each solder-mask opening 130 A-N exposes a ground plane in substrate 195. For example, solder-mask opening 132 is an opening in the solder-mask and exposes ground plane 150. Solder-mask opening 134 is an opening in the solder-mask and exposes ground plane 160. Solder-mask opening 136 is an opening in the solder-mask and exposes ground plane 170. Solder-mask opening 138 is an opening in the solder-mask and exposes ground plane 180. Solder-mask opening 131 is an opening in the solder-mask and exposes ground plane 190.

In addition, IC packages 100 commonly exhibit poor electromagnetic interference (EMI) shielding. A change in the electrical current carried by a conductor results in the radiation of electromagnetic waves. Such waves propagate through space at the speed of light, and when not wanted, are called EMI. A relatively slow change in the electrical current causes a small amount of electromagnetic radiation with a long wavelength and a low frequency. A relatively rapid change in the electrical current causes a large amount of radiation with a short wavelength and a high frequency. The unwanted high frequency electromagnetic radiation is sometimes called radio-frequency interference (RFI), but in the interest of brevity, this application refers to all unwanted electromagnetic radiation as EMI, regardless of frequency.

IC die 110 is more susceptible to higher frequency EMI. Because higher frequencies are more energetic, they may cause larger voltage swings in the metal traces on an IC die. Because modern IC gates are small in size, they operate with a low signal voltage. Thus, signal line voltage swings caused by high-frequency EMI may cause a change in logic state and may result in timing and logic failures in electronic devices.

The electromagnetic radiation generated by IC die 110 will escape from IC package 100 and potentially interfere with the operation of nearby components. Conversely, EMI from nearby components will enter IC package 100 and may interfere with the operation of IC die 110.

Figure 2:
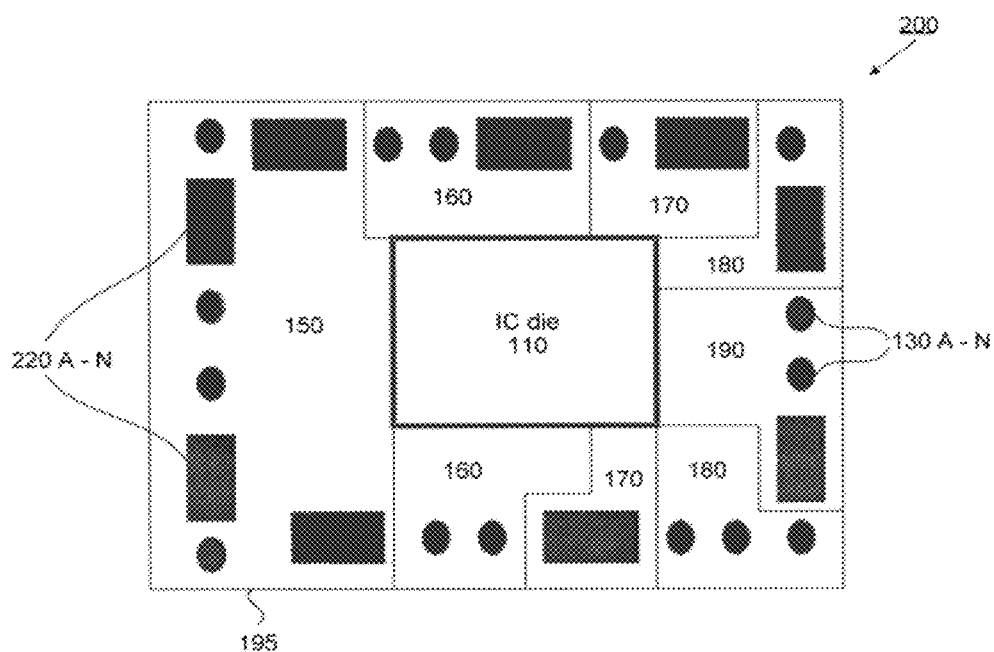
FIG. 2 illustrates an example IC package design exhibiting individual ground posts coupled to individual ground planes, according to embodiments of the invention.

FIG. 2 illustrates IC package 200 having improved performance compared to IC package 100 according to an embodiment of the invention. FIG. 2 shows IC die 110 attached to substrate 195. Substrate 195 includes ground plane 150, ground plane 160, ground plane 170, ground plane 180, and ground plane 190. Substrate 195 also includes a plurality of ground posts 220 A-N and plurality of solder-mask openings 130 A-N.

Plurality of ground posts 220 A-N provides improved EMI protection for IC package 200 as compared to IC package 100. Each ground post in plurality of ground posts 220 A-N, where N is an integer greater than one, is coupled to at least one ground plane 150, 160, 170, 180, 190. Each ground post in plurality of ground posts 220 A-N is coupled to at least one ground plane 150, 160, 170, 180, 190 through at least one solder-mask opening in plurality of solder-mask openings 130 A-N. Plurality of solder-mask openings 130 A-N expose ground planes 150, 160, 170, 180, 190 to the surface of substrate 195 allowing plurality of ground posts 220 A-N to couple to ground planes 150, 160, 170, 180, 190.

Plurality of ground posts 220 A-N is comprised of a conductive material. As would be appreciated by one having ordinary skill in the relevant art, given the description herein, the plurality of ground posts 220 A-N can be comprised of any conductive material that may include but not limited to silver conductive epoxy, copper conductive epoxy. Once coupled to ground planes 150, 160, 170, 180, 190 through plurality of solder-mask openings 130 A-N, the conductive characteristics of plurality of ground posts 220 A-N allow plurality of ground posts 220 A-N to achieve similar grounding characteristics as ground planes 150, 160, 170, 180, 190 achieve.

Plurality of ground posts 220 A-N coupled to ground planes 150, 160, 170, 180, 190 provides a similar grounding potential as ground planes 150, 160, 170, 180, 190 allowing the designer of IC package 200 to ground components directly to the plurality of ground posts 220 A-N rather than directly to ground planes 150, 160, 170, 180, 190.

The grounding of plurality of ground posts 220 A-N to ground plane 150, 160, 170, 180, 190 provides EMI protection for IC package 200 around the perimeter of substrate 195. The coupling of plurality of ground posts 220 A-N to ground plane 150, 160, 170, 180, 190 through plurality of solder-mask openings 130 A-N grounds plurality of posts 220 A-N to ground planes 150, 160, 170, 180, 190. The grounding of plurality of ground posts 220 A-N and the placement of plurality of ground posts 220 A-N around the perimeter of substrate 195 approximate an equipotential surface, or Faraday Cage around the perimeter of substrate 195. The electromagnetic radiation generated by IC die 110 that escapes from IC package 200 is decreased. Conversely, EMI from nearby components provides less interference with the operation of IC die 110.

Figure 3:
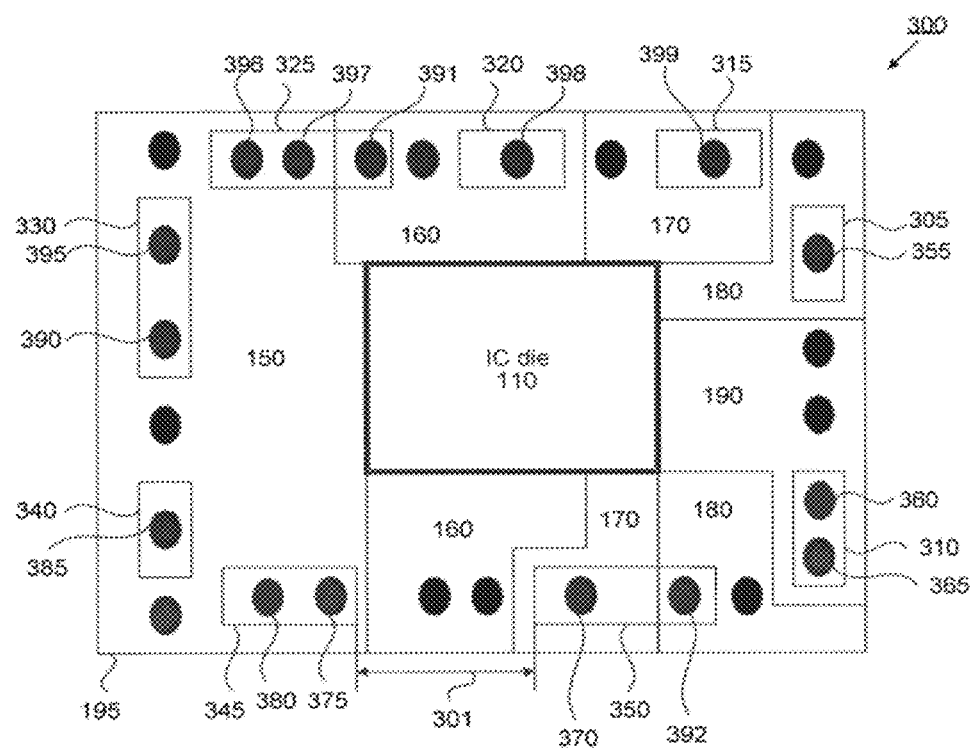
FIG. 3 illustrates an example IC package design exhibiting individual ground posts coupled to individual ground planes through individual solder-mask openings in each ground plane, according to embodiments of the invention.

FIG. 3 illustrates IC package 300 exhibiting the coupling of each ground post to each ground plane through each solder-mask opening. FIG. 3 shows IC die 110 attached to substrate 195. Substrate 195 includes ground plane 150, 160, 170, 180, and 190. Substrate 195 also includes ground post 305, 310, 350, 345, 340, 330, 325, 320, and 315. Substrate 195 also includes solder-mask opening 355, 360, 365, 370, 375, 380, 385, 390, 391, 392, 395, 396, 397, 398, and 399. Each ground post is located a maximum ground post distance 301 from each other.

Ground post 305 is coupled to ground plane 180 through solder-mask opening 355. Ground post 310 is coupled to ground plane 190 through solder-mask openings 360 and 365. Ground post 350 is coupled to ground plane 170 and ground plane 180 through solder-mask opening 370 and 392, respectively. Ground post 345 is coupled to ground plane 150 through solder-mask openings 375 and 380. Ground post 340 is coupled to ground plane 150 through solder-mask opening 385. Ground post 330 is coupled to ground plane 150 through solder-mask openings 390 and 395. Ground post 325 is coupled to ground plane 150 and ground plane 160 through solder-mask openings 391, 396, and 397, respectively. Ground post 320 is coupled to ground plane 160 through solder-mask opening 398. Ground post 315 is coupled to ground plane 170 through solder-mask opening 399.

In an embodiment, coupling of ground posts to respective ground planes can be executed to establish selective grounding of ground posts to respective ground planes. In doing so, a ground post is strategically coupled to a ground plane grounding the ground post to the ground plane so that the ground post and ground plane are isolated from a second ground post coupled to a second ground plane. For example, ground post 310 is coupled to ground plane 190 through solder-mask opening 360 and 365. Ground post 305 is coupled to ground plane 180 through solder-mask opening 355. Ground plane 180 and ground plane 190 are isolated ground planes in substrate 195. As a result, ground post 305 is isolated from ground post 310.

A designer can strategically isolate noisy components by isolating the ground plane in which the noisy component is grounded to, and therefore isolate the noise to a single ground plane. Any noise imputed onto ground plane 190 would be isolated to ground post 310 and would not be imputed onto ground post 305 that is coupled to ground plane 180.

In an embodiment, ground planes are shorted together by the strategic placement of ground posts. A ground post is strategically coupled to two or more ground planes grounding the ground post to the two or more ground planes that the ground post is coupled to. The ground post grounded to two or more ground planes in turn couples the two or more ground planes to each other. For example, ground post 350 is coupled to ground plane 170 through solder-mask opening 370. Ground post 350 is also coupled to ground plane 180 through solder-mask opening 392. Ground post 350 is grounded to both ground plane 170 and ground plane 180. Ground plane 170 and ground plane 180 are no longer isolated from each other but are coupled.

An effective Faraday cage is still established around the perimeter of substrate 195 regardless of whether the ground planes are isolated from each other or coupled together. The coupling of ground post 310 to ground plane 190 grounds ground post 310 to ground plane 190. The coupling of ground post 305 to ground plane 180 grounds ground post 305 to ground plane 180. The coupling of ground post 350 to ground plane 170 and 180 grounds ground post 350 to ground plane 170 and 180. The coupling of ground post 345, 340, and 330 to ground plane 150 grounds ground post 345, 340, and 330 to ground plane 150. The coupling of ground post 325 to ground plane 150 and 160 grounds ground post 325 to ground plane 150 and 160. The coupling of ground post 320 to ground plane 160 grounds ground post 320 to ground plane 160. The coupling of ground post 315 to ground plane 170 grounds ground post 315 to ground plane 170. The grounding of each ground post around the perimeter of substrate 195 creates an effective Faraday cage.

In an embodiment, an optimal Faraday cage is created based on a maximum distance in which each ground post is located from each other around the perimeter of substrate 195. In order to effectively limit the effects Of EMI escaping from IC package 300 and protecting IC package 300 from components nearby, each ground post must be placed a maximum ground post distance 301 from each other to establish an optimal Faraday cage around the perimeter of substrate 195. Each ground post is located a maximum ground post distance 301 equal to one-tenth of lambda from each other. However, each ground post may be located closer than one-tenth lambda from each other based on the EMI requirements for IC die 110. Each ground post may be positioned an appropriate distance from each other in order to fine tune the attenuation for each individual IC die 110, including spacing beyond one-tenth lambda if less EMI attenuation is desired. As would be appreciated by one having ordinary skill in the relevant art, given the description herein, lambda equates to wavelength. A wavelength is the spatial period of the wave. The wavelength applicable for IC package 300 is the wavelength of the EMI waves emanating from IC package 300 and the wavelength of EMI waves emanating from components nearby to IC package 300.

For example, ground post 345 and ground post 350 are located a maximum ground post distance 301 from each other. Maximum ground post distance 301 between ground post 345 and ground post 350 is a maximum distance of one-tenth of lambda where lambda is the wavelength of EMI waves emanating from IC die 110 and the wavelength of EMI waves emanating from components nearby. As would be appreciated by one having ordinary skill in the relevant art, given the description herein, maximum ground post distance 301 is a maximum distance each ground post is located from each other around the perimeter of substrate 195. Each ground post may be located closer together than one-tenth of lambda and still provide an optimal Faraday cage around the perimeter of substrate 195.

Such grounding and the placement of ground posts around the perimeter of substrate 195 approximate an equipotential surface, or Faraday Cage around the perimeter of substrate 195. The electromagnetic radiation generated by IC die 110 that escapes from IC package 300 is decreased. Conversely, EMI from nearby components provides less interference with the operation of IC die 110.

Figure 4:
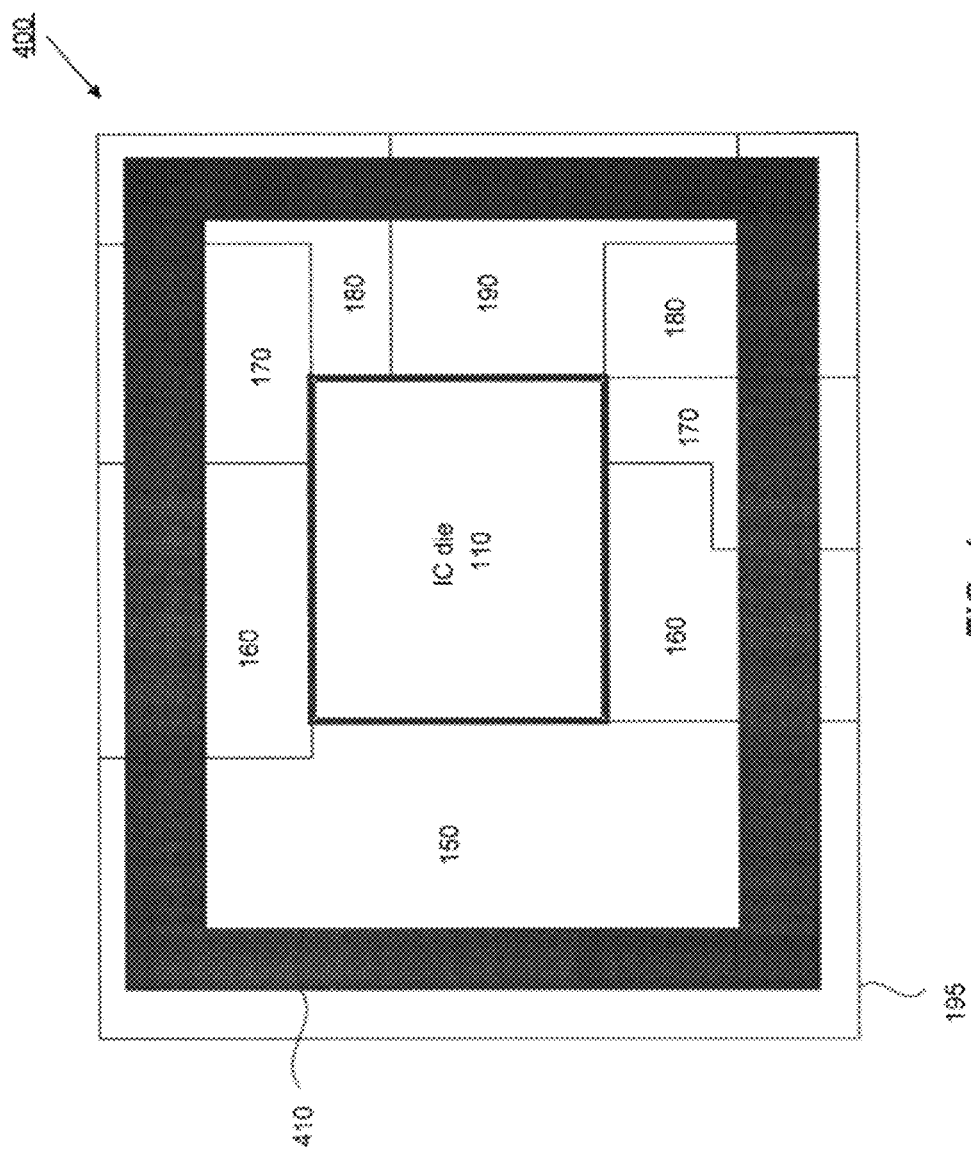
FIG. 4 illustrates an example IC package design exhibiting a ground ring coupled to each ground plane, according to embodiments of the invention.

FIG. 4 illustrates an example IC package design 400 where each ground plane is shorted together by a ground post ring. IC die 110 is attached to substrate 195. Substrate 195 includes ground plane 150, ground plane 160, ground plane 170, ground plane 180, and ground plane 190. Substrate 195 also includes ground ring 410.

In FIGS. 2 and 3, ground posts are coupled to respective ground planes often times isolating ground posts from each other and maintaining isolation between each ground plane. In doing so, a distance remains between each ground post providing some minimal risk that some minimal level of EMI emissions may escape from IC device 200 and 300 and that IC die 110 may still be susceptible to some minimal EMI emissions from components nearby. FIG. 4 exhibits an embodiment in which any distance between individual ground posts is eliminated.

A single ground post or ground ring 410 is established around the entire perimeter of substrate 195 completely surrounding IC die 110. Ground ring 410 like the ground posts in FIGS. 2 and 3 is grounded to a respective ground plane. In order for ground post 410 to completely encompass IC die 110 around the perimeter of substrate 195, ground ring 410 is coupled to each ground plane of substrate 195. Ground ring 410 is coupled to ground plane 150, ground plane 160, ground plane 170, ground plane 180, and ground plane 190. The coupling of ground ring 410 grounds ground ring 410 to each ground plane and therefore each ground plane is coupled to each other. In turn, the coupling of ground ring 410 to each ground plane also couples each ground plane to each other. Ground ring 410 is coupled to ground plane 150, 160, 170, 180, and 190 and each ground plane 150, 160, 170, 180, and 190 is coupled to each other.

The grounding of ground ring 410 to ground plane 150, 160, 170, 180, and 190 provides EMI protection for IC package 400 around the perimeter of substrate 195. The coupling of ground ring 410 to ground plane 150, 160, 170, 180, and 190 grounds ground ring 410. The grounding of ground ring 410 and the placement of ground ring 410 around the perimeter of substrate 195 completely encompassing IC die 110 approximate an equipotential surface or a complete Faraday Cage around the perimeter of substrate 195. The electromagnetic radiation generated by IC die that escapes IC package 400 is significantly reduced. Conversely, EMI from nearby components provides minimal interference with the operation of IC die 110.

Figure 5:
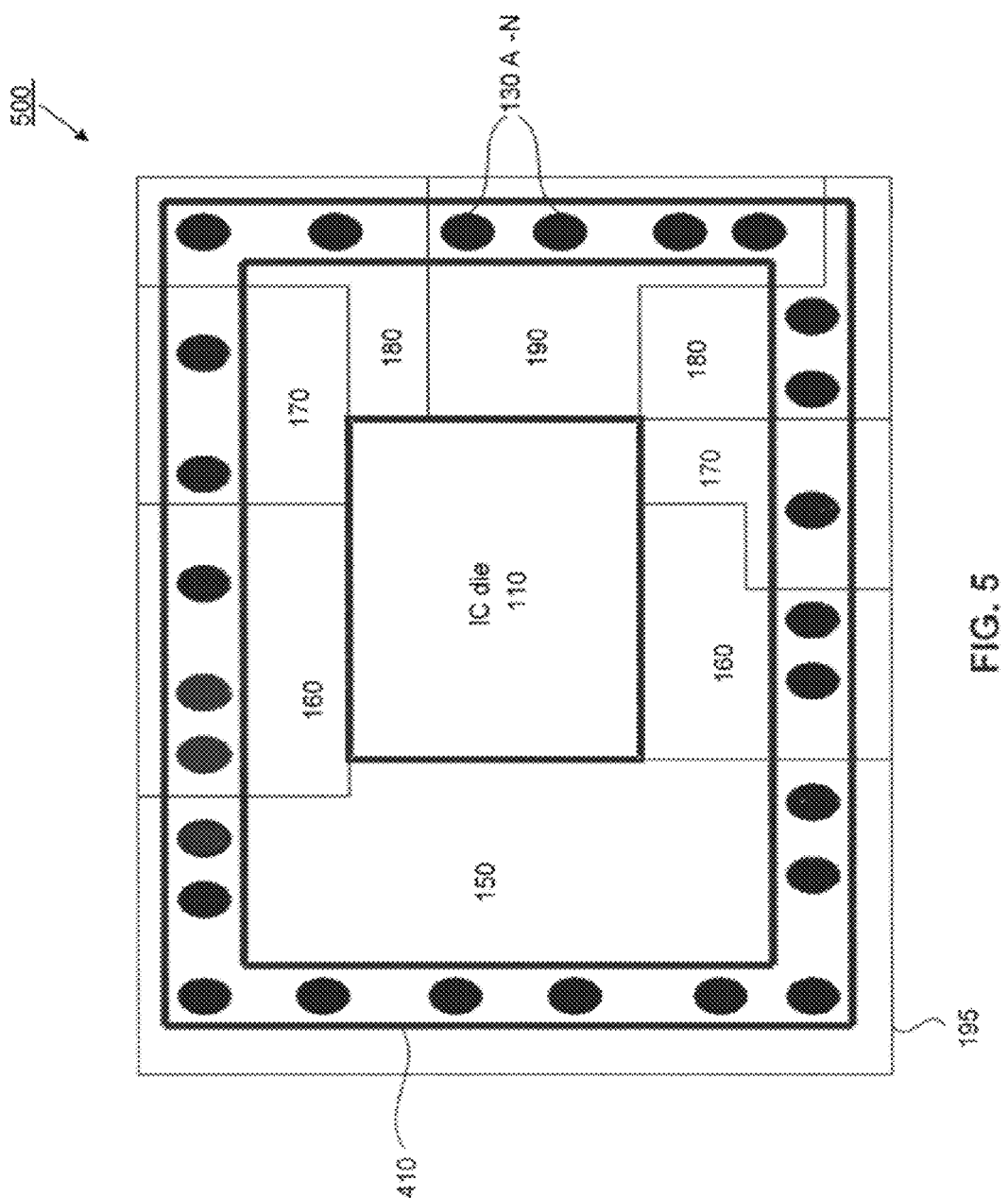
FIG. 5 illustrates an example IC package design exhibiting a ground ring coupled to each ground plane through all solder-mask openings for each ground plane, according to embodiments of the invention.

FIG. 5 illustrates IC device 500 where each ground plane is coupled together and coupled to the ground post ring through each solder-mask opening for each ground plane. IC die 110 is attached to substrate 195. Substrate 195 includes ground plane 150, ground plane 160, ground plane 170, ground plane 180, and ground plane 190. Substrate 195 also includes ground ring 410 and plurality of solder-mask openings 130 A-N.

Ground ring 410 is coupled to each ground plane through plurality of solder-mask openings 130 A-N. Ground ring 410 is coupled to ground plane 150, ground plane 160, ground plane 170, ground plane 180, and ground plane 190 through plurality of solder-mask openings 130 A-N. Plurality of solder-mask openings 130 A-N expose ground plane 150, ground plane 160, ground plane 170, ground plane 180, and ground plane 190 so that ground ring 410 can be coupled to ground plane 150, ground plane 160, ground plane 170, ground plane 180, and ground plane 190.

Figure 6A:
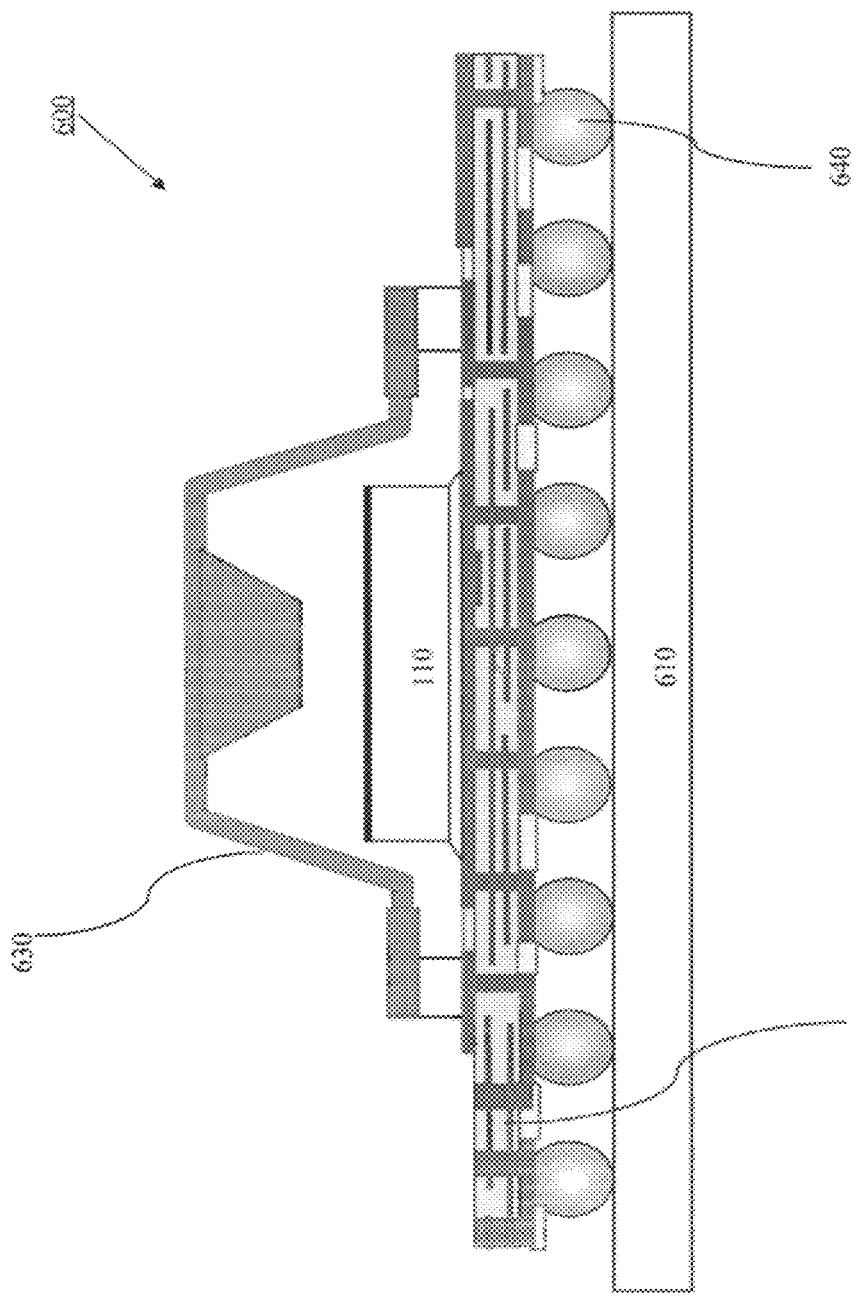
FIG. 6A illustrates an example ball grid array (BGA) IC package.

FIG. 6A illustrates a conventional ball grid array (BGA) package. FIG. 6 shows a cross-sectional view of a BGA package 600 with an IC die 110 mounted on printed circuit substrate 620 and electrically connected to PCB 610 through solder balls 640. For further detail on a package similar to BGA package 600, see U.S. Pat. No. 5,977,626, "Thermally and Electrically Enhanced PBGA Package," to Wang et al., which is incorporated by reference in its entirety. BGA package 600 includes a drop-in heat spreader 630 to promote dissipation of heat. Drop-in heat spreader 630 only provides limited EMI shielding, if any. For example, EMI generated outside BGA package 600 can penetrate printed circuit substrate 620 and interfere with the operation of IC die 110. Also, EMI generated by IC die 110 can escape BGA package 600 through trace metal openings or gaps in printed circuit substrate 620.

Example Enclosure Structures

Example embodiments for IC packages are described in this section. Further embodiments will become apparent to persons having skill in the relevant art(s) from the teachings herein. Elements of the IC package embodiments described herein can be combined in any manner.

Figure 7:
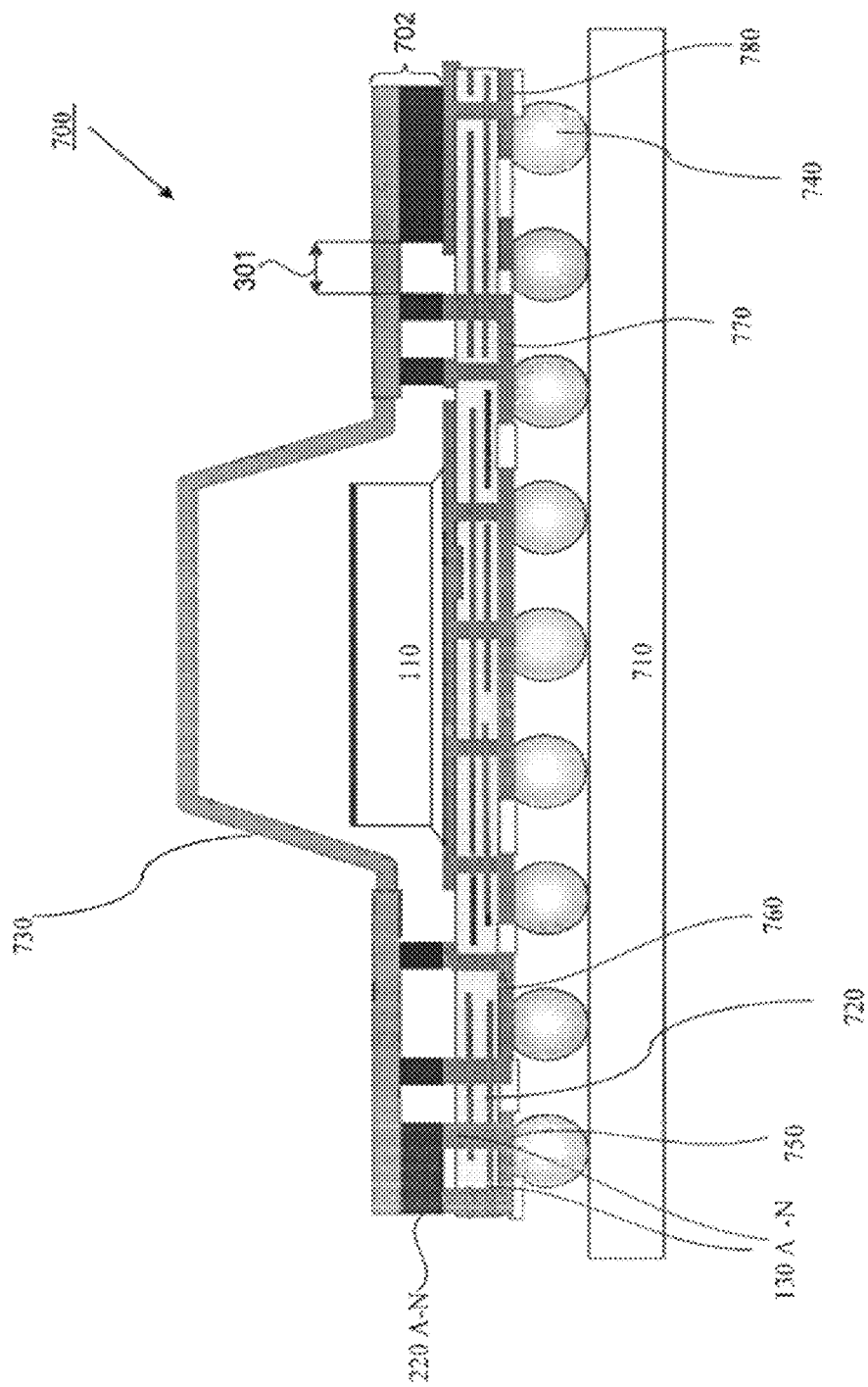
FIG. 7 illustrates a cross-sectional view of an example BGA IC package design with ground posts coupled to ground planes, according to embodiments of the invention.

FIG. 7 shows an example BGA package 700 having improved performance compared to BGA packages 600 and 602, according to an embodiment of the invention. FIG. 7 shows a cross-sectional view of a BGA package 700 with IC die 110 mounted on printed circuit substrate 720 and electrically connected to printed circuit board (PCB) 710 through solder balls 740. BGA package 700 also includes package lid 730 and plurality of ground posts 220 A-N. Printed circuit substrate 720 includes ground plane 750, ground plane 760, ground plane 770 and ground plane 780. Printed circuit substrate 720 also includes plurality of solder-mask openings 130 A-N. Each ground post 220 A-N is a maximum ground post distance 301 from each other. Enclosure structure 702 is formed by plurality of ground posts 220 A-N and package lid 730.

PCB 710 and printed circuit substrate 720 can be any type of circuit board such as a printed circuit board (PCB), a printed wire board (PWB), etc. as would be understood by someone skilled in the art.

Plurality of ground posts 220 A-N and package lid 730 provide improved EMI protection for BGA package 700 as compared to BGA package 600 and 602. Each ground post in plurality of ground posts 220 A-N is coupled to at least one ground plane 750, 760, 770, and 780 through at least one solder-mask opening in plurality of solder-mask openings 130 A-N. Plurality of solder-mask openings 130 A-N expose ground planes 750, 760, 770, 780 to the surface of printed circuit substrate 720 allowing plurality of ground posts 220 A-N to couple to ground planes 750, 760, 770, 780. Package lid 730 is coupled to each ground post in plurality of ground posts 220 A-N. Plurality of ground posts 220 A-N and package lid 730 form an enclosure structure 702 that substantially encloses IC die 110, providing improved structural integrity, EMI shielding, thermal performance, and environmental (e.g., mechanical shock, vibration, caustic, moisture, and radiation) protection.

Plurality of ground posts 220 A-N is comprised of a conductive material. As would be appreciated by one having ordinary skill in the relevant art, given the description herein, plurality of ground posts 220 A-N can be comprised of any conductive material that may include but not limited to silver conductive epoxy, copper conductive epoxy. Once coupled to ground planes 750, 760, 770, 780 through plurality of solder-mask openings 130 A-N, the conductive characteristics of plurality of ground posts 220 A-N allow ground posts 220 A-N to achieve similar grounding characteristics as ground planes 750, 760, 770, 780 achieve. Plurality of ground posts 220 A-N coupled to ground planes 750, 760, 770, 780 provides a similar grounding potential as ground planes 750, 760, 770, 780 allowing the designer of BGA package 700 to ground components directly to the plurality of ground posts 220 A-N rather than directly to ground planes 750, 760, 770, 780.

Package lid 730 is coupled to plurality of ground posts 220 A-N. Package lid 730 is comprised of a thermally conductive material and/or an electrically conductive material, such as a metal. For example, the material for package lid 730 may include copper, a copper alloy, (e.g., C194, C151, C7025, or EFTEC/64T), aluminum, an aluminum alloy, ferromagnetic materials, laminated copper or iron, etc. Other metals and combinations of metals/alloys, or other thermally and electrically conductive materials (e.g., ceramics, metallized plastics, laminated metal foils on plastic or ceramic, etc.) may be used. Protective lid 730 and plurality of ground posts 220 A-N may be made of the same material. Furthermore, protective lid 730 may have any thickness, depending on the particular application. For example, protective lid 730 may have a thickness of less than 1.0 mm.

Protective lid 730 may also be represented by an internal and/or external heat-slug. In such an embodiment, protective lid 730 may be represented by a plastic molding with the heat-slug located inside the plastic molding. As would be understood by one skilled in the art, the heat-slug enables the heat from IC die 110 to be transferred more directly to a cooling apparatus such as a heat sink.

The conductive material of protective lid 730 allows protective lid 730 to be grounded when coupled to plurality of ground posts 220 A-N. The grounding of plurality of ground posts 220 A-N to ground planes 750, 760, 770, 780 also grounds package lid 730. Package lid 730 is coupled to each ground post in plurality of ground posts 220 A-N. The grounding of plurality of ground posts 220 A-N to ground planes 750, 760, 770, 780 in turn grounds package lid 730. The grounding of plurality of ground posts 220 A-N to ground planes 750, 760, 770, 780 and the grounding of package lid 730 to plurality of ground posts 220 A-N creates enclosure structure 702 around IC die 110. Enclosure structure 702 acts as an optimal Faraday cage around IC die 110. The electromagnetic radiation generated by IC die 110 that escapes from BGA package 700 is decreased. Conversely, EMI from nearby components provides less interference with the operation of IC die 110.

As noted above, an optimal Faraday cage is created based on a maximum distance in which each ground post is located from each other on the surface of substrate 820. In order to effectively limit the effects of EMI escaping from IC package 300 and protecting IC package 300 from components nearby, each ground post must be place a maximum ground post distance 301 from each other to establish an optimal Faraday cage around IC die 110. Each ground post is located a maximum ground post distance 301 equal to one-tenth of lambda from each other where lambda is the wavelength of the EMI emissions.

Further Example Integrated Circuit Packages

Figure 8:
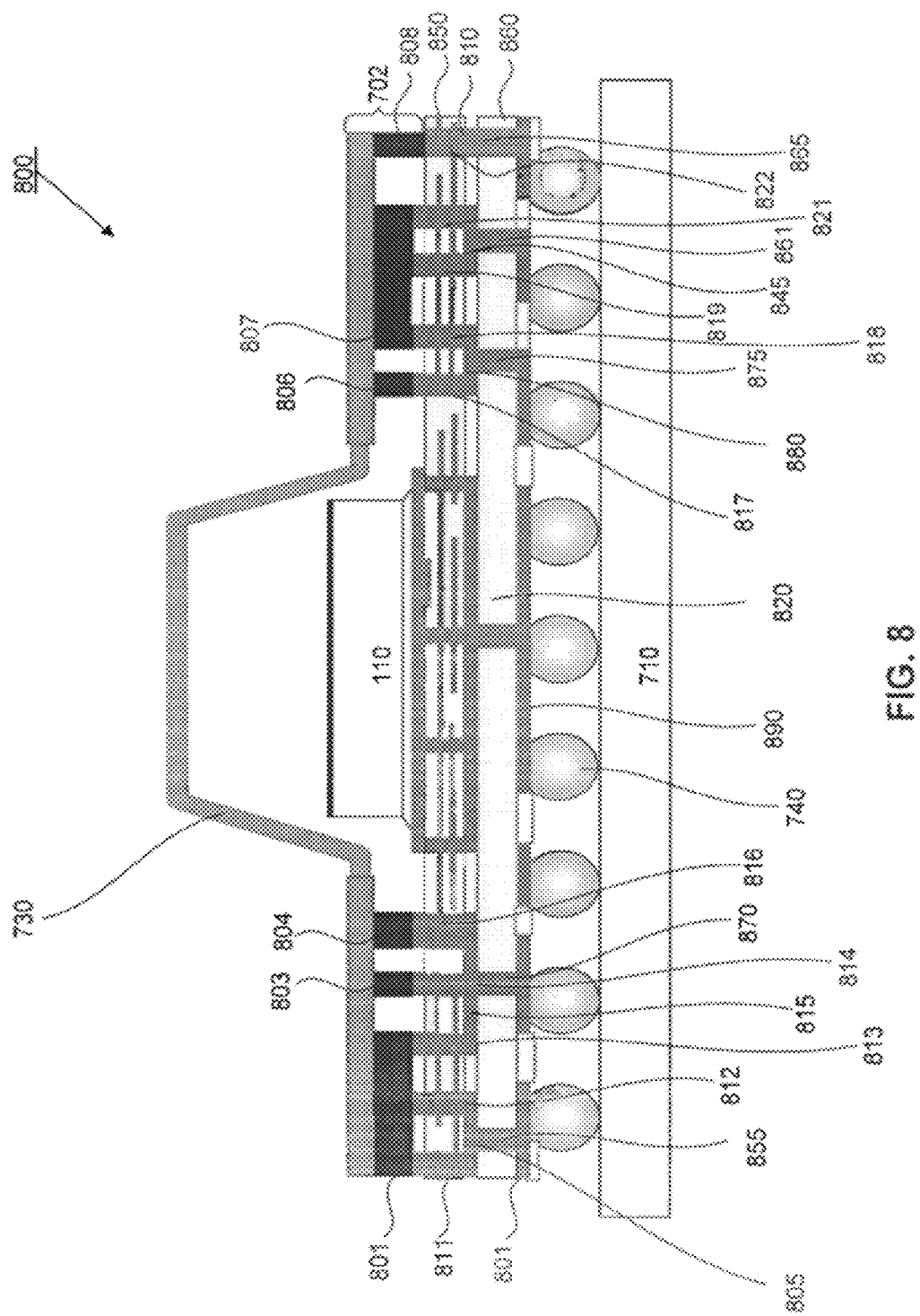
FIG. 8 illustrates a cross-sectional view of an example BGA IC package design with the ground posts coupled to ground planes located in a top level of the substrate, according to embodiments of the invention.

FIG. 8 illustrates a cross-sectional view of BGA package 800 having isolated ground connections for groups of ground posts. IC die 110 is mounted on printed circuit substrate 820 and electrically connected to PCB 710 through solder balls 740. BGA package 800 also includes package lid 730. BGA package 800 also includes ground post 801, 803, 804, 806, 807, 808. Printed circuit substrate 820 includes upper level substrate 850 and lower level substrate 860. Upper level substrate 850 includes ground planes 805, 815, 880, 845, and 810. Upper level substrate 850 also includes solder-mask opening 811, 812, 813, 814, 816, 817, 818, 819, 821, and 822. Lower level substrate 860 includes common ground 890 and ground connection 855, 870, 875, 861, and 865. Package lid 730 coupled to ground posts 801, 803, 804, 806, 807, 819, and 822 form enclosure structure 702.

Ground post 801 is coupled to ground plane 805 through solder-mask opening 811 and 812 and ground plane 815 through solder-mask opening 813. Ground post 803 is coupled to ground plane 815 through solder-mask opening 814. Ground post 804 is coupled to ground plane 815 through solder-mask opening 816. Ground post 806 is coupled to ground plane 880 through solder-mask opening 817. Ground post 807 is coupled to ground plane 880 through solder-mask opening 818 and ground plane 845 through solder-mask opening 819 and 821. Ground post 808 is coupled to ground plane 810 through solder-mask opening 822.

Ground plane 805 is coupled to common ground 890 by ground connection 855. Ground plane 815 is coupled to common ground 890 by ground connection 870. Ground plane 880 is coupled to common ground 890 by ground connection 875. Ground plane 845 is coupled to common ground 890 by ground connection 861. Ground plane 810 is coupled to common ground 890 by ground connection 865. Package lid 730 is coupled to ground post 801, 803, 804, 806, 807, and 809 forming enclosure structure 702 around IC die 110.

In an embodiment, coupling of ground posts to respective ground planes can be executed to establish selective grounding of ground posts to respective ground planes. In doing so, a ground post is strategically coupled to a ground plane grounding the ground post to the ground plane so that the ground post and ground plane are isolated from a second ground post coupled to a second ground plane. Each ground plane is then coupled to a common ground. For example, ground post 803 is coupled to ground plane 815 through solder-mask opening 814. Ground post 808 is coupled to ground plane 810 through solder-mask opening 822. Ground plane 815 and ground plane 810 are isolated ground planes in printed circuit substrate 820. As a result, ground post 803 is isolated from ground post 808. Ground plane 815 and ground plane 810 are coupled to common ground 801.

A designer can strategically isolate noisy components by isolating the ground plane in which the noisy component is grounded to and in turn isolate the noise to a single ground plane. Any noise imputed onto ground plane 810 would be isolated to ground post 808 and would not be imputed onto ground post 803 that is coupled to ground plane 815.

In an embodiment, ground planes are shorted together by the strategic placement of ground posts. A ground post is strategically coupled to two or more ground planes grounding the ground post to the two or more ground planes that the ground post is coupled to. The ground post grounded to two or more ground planes in turn couples the two or more ground planes to each other. For example, ground post 801 is coupled to ground plane 805 through solder-mask opening 811 and 812. Ground post 801 is also coupled to ground plane 815 through solder-mask opening 813. Ground post 801 is grounded to both ground plane 805 and ground plane 815. Ground plane 805 and ground plane 815 are no longer isolated from each other but are coupled.

The positioning of ground plane 805, 815, 880, 845, and 810 at the surface of printed circuit substrate 820 in upper level substrate 850 allows each ground plane 805, 815, 880,

845, 810 to be coupled to each ground post through solder-mask openings. As noted above, each ground plane 805, 815, 880, 845, and 810 may be comprised of a layer of copper. A solder-mask encompasses the surface of printed circuit substrate 820. Each solder-mask opening exposes the respective ground plane allowing the respective ground post to couple to the ground plane. The coupling of ground posts to ground planes located at the surface of printed circuit substrate 820 in upper level substrate 850 through solder-mask openings is a cost effective method of accessing ground planes.

In an embodiment, the location ground plane 805, 815, 880, 845, and 810 is located below the surface of printed circuit substrate 820 and not in upper level substrate 850, but instead in lower level substrate 860. When ground planes 805, 815, 880, 845, and 810 are located below the surface of printed circuit substrate 820 in lower level substrate 860, they can no longer be exposed by solder-mask openings. Ground post 801, 803, 804, 806, 807, and 809 must be coupled to ground plane 805, 815, 880, 845, and 810 through vias.

As would be appreciated by one having ordinary skill in the relevant art, given the description herein, a via is a vertical electrical connection between different layers of conductors in a printed circuit board. In such an embodiment, each solder-mask opening used to couple each ground post to each ground plane would be replaced by a via. Where a solder-mask opening is an opening exposing the surface of the ground plane, a via is an actual vertical channel taken from the surface of printed circuit substrate 820 to the ground plane located in a lower level of printed circuit substrate 820 such as lower level substrate 860. A via approach brings added cost to the production of BGA package 800 as compared to using solder-mask openings.

In an embodiment, package lid 730 is coupled to each ground post creating enclosure structure 702 establishing an effective Faraday cage around IC die 110. An effective Faraday cage is still established around IC die 110 regardless of whether the ground planes are isolated from each other or coupled together. Package lid 730 is coupled to ground post 801, ground post 803, ground post 804, ground post 806, ground post 807 and ground post 808. Each ground post 801, 803, 804, 806, 807, and 809 is grounded by the coupling to each respective ground plane 805, 815, 880, 845, and 810. The coupling of package lid 730 to ground post 801, 803, 804, 806, 807, and 809 grounds package lid 730.

The placement of ground posts 801, 803, 804, 806, 807, and 808 around the perimeter of IC device 110 and package lid 730 placed on top of IC device 110 creates enclosure structure 702 around IC device 110. The grounding of ground posts 801, 803, 804, 806, 807, 822 and package lid 730 may form a near-equipotential surface, such that enclosure structure 702 approximates an ideal Faraday Cage. In this manner, IC die 110 is isolated from external EMI. Additionally, external devices are also shielded from EMI generated by IC die 110.

Figure 9:
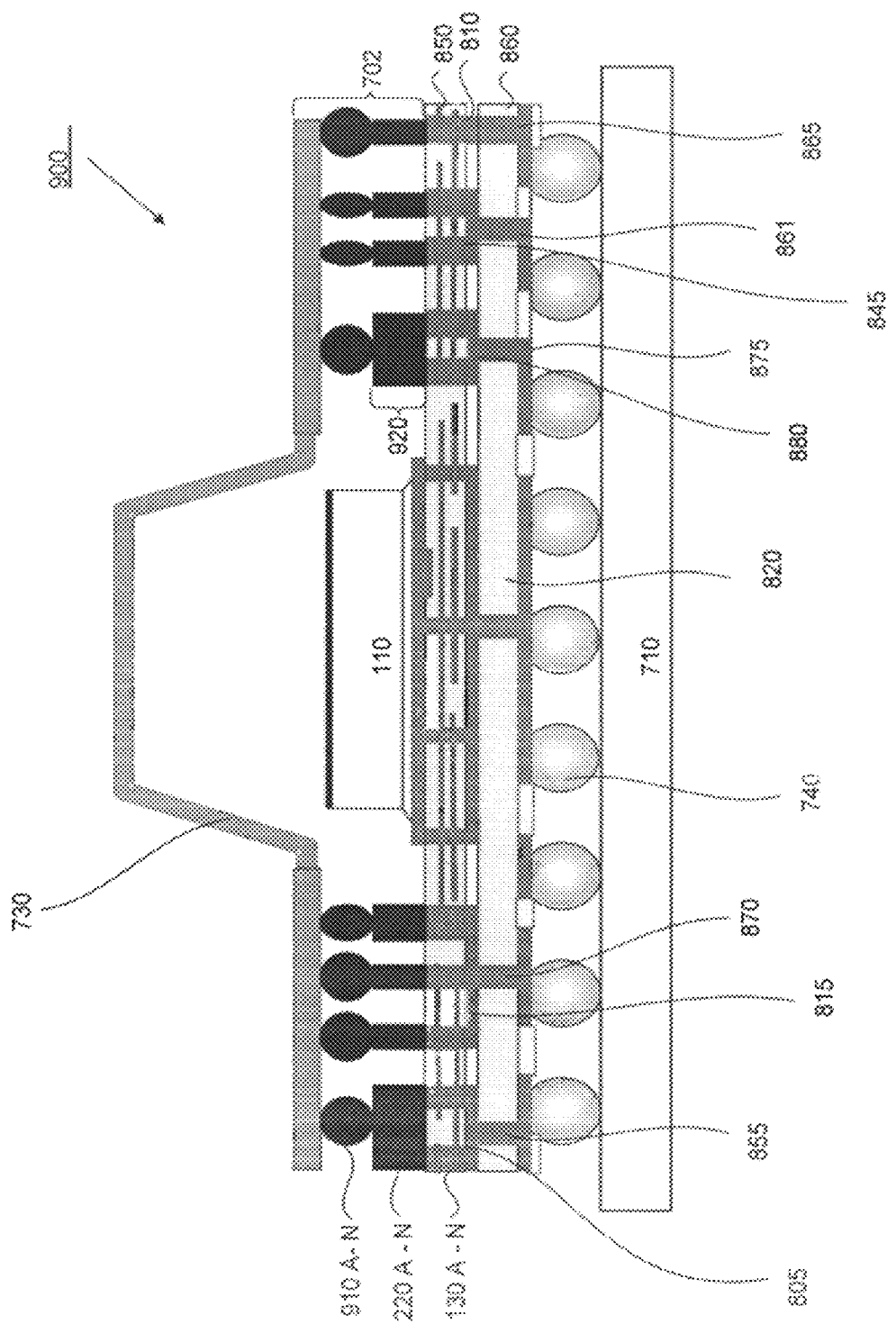
FIG. 9 illustrates a cross-sectional view of an example BGA IC package design with the ground posts coupled to a package lid by epoxy, according to embodiments of the invention.

FIG. 9 illustrates a cross-sectional view of a BGA package 900 where the ground posts are coupled to package lid 730 by epoxy. IC die 110 is mounted to printed circuit substrate 820 and electrically connected to PCB 710 through solder balls 740. BGA package 900 includes package lid 730, plurality of ground posts 220 A-N, and plurality of epoxy couplings 910 A-N. Each of the plurality of ground posts 220 A-N is a height 920 above the surface of printed circuit substrate 820. Plurality of ground posts 220 A-N, plurality of epoxy couplings 910 A-N and package lid 730 creates enclosure structure 702.

The coupling between plurality of ground posts 220 A-N and ground plane 805, 815, 880, 845, and 810 along with the coupling between plurality of ground posts 220 A-N and package lid 730 is improved with the use of adhesive materials. In an embodiment, thermally and/or electrically conductive adhesive materials (e.g., epoxy filled with metal or other conductive flakes, solder, etc.) may be used to improve the couplings used in BGA package 900. An adhesive material for plurality of epoxy couplings 910 A-N, where N is an integer greater than 1, may be used to attach plurality of ground posts 220 A-N to ground plane 805, 815, 880, 845, and 810. An adhesive material for plurality of epoxy couplings 910 A-N may also be used to attach package lid 730 to plurality of ground posts 220 A-N. In a further embodiment, plurality of ground posts 220 A-N may be comprised of an adhesive material where plurality of epoxy couplings 910 A-N act as plurality of ground posts 220 A-N.

The placement of plurality of ground posts 220 A-N around IC device 110 and package lid 730 placed on top of IC device 110 with the use of adhesive material 910 A-N creates enclosure structure 702 around IC device 110. Enclosure structure 702 may form a near-equipotential surface, such that enclosure structure 702 approximates an ideal Faraday Cage. In this manner, IC die 110 is isolated from external EMI. Additionally, external devices are also shielded from EMI generated by IC die 110.

Figure 10:
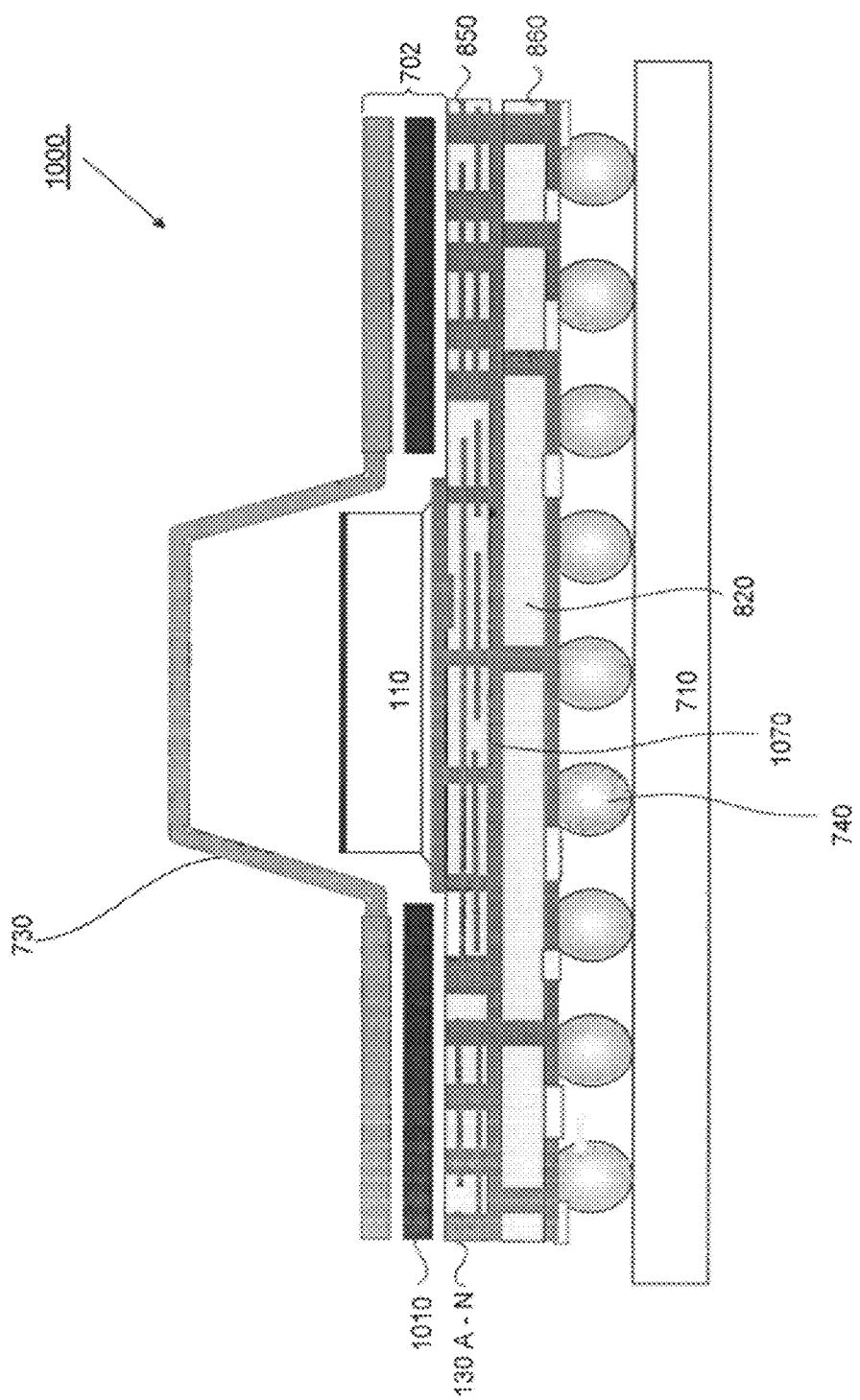
FIG. 10 illustrates a cross-sectional view of an example BGA IC package design with a ground ring, according to embodiments of the invention.

FIG. 10 illustrates a cross-sectional view of BGA package 1000 having a substrate with two levels. IC die 110 is mounted on printed circuit substrate 820 and electrically connected to PCB 710 through solder balls 740. BGA package 1000 also includes ground ring 1010 and package lid 730. Printed circuit substrate 820 includes upper level substrate 850 and lower level substrate 860. Upper level substrate 850 includes a shorted ground plane 1070 and plurality of solder-mask openings 130 A-N. Package lid 730 coupled to ground ring 1010 creates enclosure structure 702.

In FIGS. 7, 8, 9, ground posts are coupled to respective ground planes often times isolating ground posts from each other and maintaining isolation amongst each ground plane. In doing so, a distance remains between each ground post providing some minimal risk that minimal level of EMI emissions may escape from BGA package 700, 800, and 900 and that IC die 110 may still be susceptible to minimal EMI emissions from components nearby. FIG. 10 exhibits an embodiment in which any distance between individual ground posts is eliminated.

A single ground post or ground ring 1010 is established on the surface of printed circuit substrate 820 completely surrounding IC die 110. Ground ring 1010 like the ground posts in FIGS. 7, 8, 9 is grounded to a respective ground plane. In order for ground ring 1010 to completely encompass IC die 110 around on the surface of printed circuit substrate 820, ground ring 1010 is coupled to each ground plane of printed substrate. Ground ring 1010 in turn shorts each ground plane to each other creating single shorted ground plane 1070. Ground ring 1010 is coupled to shorted ground plane 1020 through plurality of solder-mask openings 130 A-N. The coupling of ground ring 1010 grounds ground ring 1010 to shorted ground plane 1070. In turn, the coupling of package lid 730 to ground ring 1010 grounds package lid 730 creating enclosure structure 702 around IC die 110.

In an embodiment, printed circuit substrate 820 has a plurality of ground planes located in upper level substrate 850. Ground ring 1010 is coupled to each ground plane through plurality of solder-mask openings 130 A-N. The coupling of ground ring 1010 to each ground plane, grounds ground ring 1010. The coupling of ground ring 1010 to each ground plane also couples each ground plane forming shorted ground plane 1070 where each individual ground plane becomes single shorted ground plane 1070. In turn, the coupling of package lid 730 to ground ring 1010 grounds package lid 730 creating enclosure structure 702 around IC die 110.

The placement of ground ring 1010 around IC device 110 and package lid 730 placed on top of IC device 110 creates enclosure structure 702 around IC device 110. The grounding of ground ring 1010 and package lid 730 may form a near-equipotential surface, such that enclosure structure 702 approximates an ideal Faraday Cage. In this manner, IC die 110 is isolated from external EMI. Additionally, external devices are also shielded from EMI generated by IC die 110.

Example Manufacturing Processes

Figure 11:
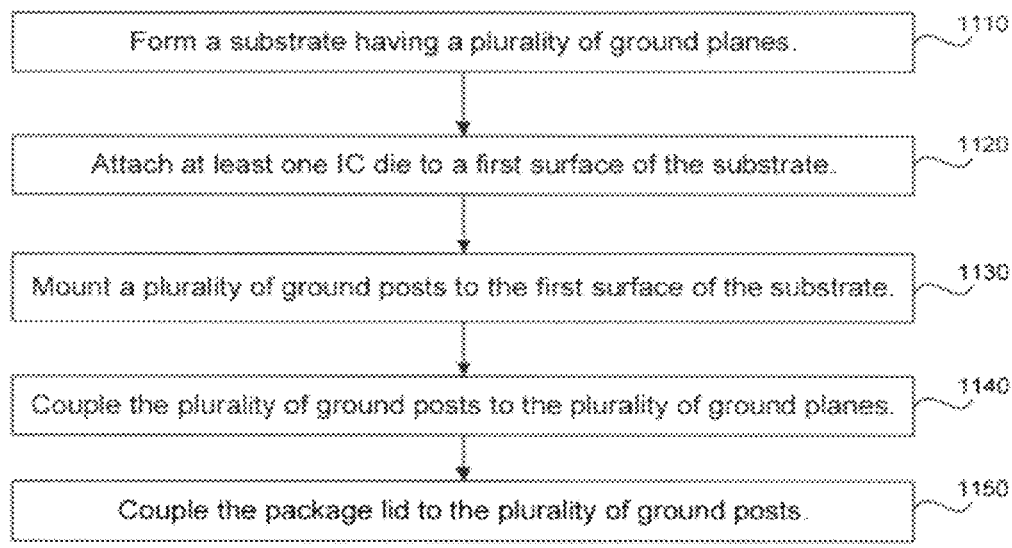
FIG. 11 shows a flowchart illustrating an example embodiment for assembling an IC package, according to embodiments of the invention.

This section and FIG. 11 summarizes one of the techniques described herein presenting a flowchart of an exemplary method 1100 of assembling an integrated circuit, such as BGA package 800 shown in FIG. 8, according to an embodiment of the present invention. As would be understood by one skilled in the art, these assembly processes can be adapted to assemble any embodiments, including those in FIGS. 6-10. The steps in FIG. 11 do not necessarily have to occur in the order shown, as will be apparent to persons skilled in the relevant art(s) based on the teachings herein. Other operational and structural embodiments will be apparent to persons skilled in the relevant art(s) based on the following discussion.

As shown in FIG. 11, an embodiment of method 1100 begins at step 1110 where a substrate having a plurality of ground planes is formed. In an embodiment, as shown in FIG. 8, a substrate, such as printed circuit substrate 820, having a plurality of ground planes, such as ground plane 805, is formed. Once step 1110 is complete, method 1100 proceeds to step 1120.

At step 1120, an IC die is attached to a first surface of the substrate. In an embodiment, as shown in FIG. 8, an IC die, such as IC die 110, is attached to a first surface of the substrate, such as printed circuit substrate 820. Once step 1120 is complete, method 1100 proceeds to step 1130.

At step 1130, a plurality of ground posts are mounted to the first surface of the substrate. In an embodiment, as shown in FIG. 8, a plurality of ground posts, such as ground post 801, is mounted to the first surface of the substrate, such as printed circuit substrate 720. Once step 1130 is complete, method 1100 proceeds to step 1140.

At step 1140, the plurality of ground posts are coupled to the plurality of ground planes. In an embodiment, as shown in FIG. 8, the plurality of ground posts, such as ground post 803 is coupled to the plurality of ground planes, such as ground plane 815. Once step 1140 is complete, method 1100 proceeds to step 1150.

At step 1150, the package lid is coupled to the plurality of ground posts. In an embodiment, as shown in FIG. 8, a package lid, such package lid 730, is coupled to the plurality of ground posts, such as ground post 806. When step 1170 is complete, method 1100 ends.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device package, comprising:
   an IC die;
   a package lid;
   a plurality of ground posts; and
   a substrate having opposing first and second surfaces, comprising a plurality of ground planes disposed in the substrate;
   wherein the IC die is attached to the first surface of the substrate;
   wherein the plurality of ground posts are disposed on the first surface of the substrate, and at least two ground planes of the plurality of ground planes disposed in the substrate are directly coupled to each other via a ground post of the plurality of ground posts, the ground post being spaced apart from the first surface of the substrate; and
   wherein the package lid is coupled to the plurality of ground posts.

2. The package of claim 1, wherein the package lid and the plurality of ground posts shield electromagnetic interference (EMI) emanating from the IC die, and shield the IC die from EMI radiating towards it from outside the IC device package.

3. The package of claim 1, wherein the package lid and the plurality of ground posts shield EMI emanating from the IC die due to resonance within the substrate or a package cavity, wherein the package cavity houses the IC die.

4. The package of claim 1, wherein the package lid and the plurality of ground posts form an enclosure structure that substantially encloses the IC die, whereby the enclosure structure forms a Faraday cage.

5. The package of claim 1, wherein the IC die is positioned on the first surface of the substrate and a printed circuit board is mounted to a second surface of the substrate.

6. The package of claim 1, wherein the substrate has a plurality of substrate openings that expose each ground plane of the plurality of ground planes, wherein each of the plurality of substrate openings facilitates coupling to the plurality of ground planes.

7. The package of claim 6, wherein the plurality of ground posts are coupled to the plurality of ground planes by a thermally and electrically conductive means in each of the plurality of substrate openings.

8. The package of claim 1, wherein a thermally and electrically conductive coupling means is configured to couple the plurality of ground posts to the plurality of ground planes and to couple the plurality of ground posts to the package lid.

9. The package of claim 8, wherein the thermally and electrically conductive coupling means comprises an electrically conductive epoxy.

10. The package of claim 1, wherein each ground post of the plurality of ground posts are positioned around a perimeter of the substrate and are spaced apart by a maximum distance of one-tenth of a wavelength of EMI interference generated by the IC device package.

11. The package of claim 1, wherein each of the plurality of ground planes is shorted to each other to create a plurality of shorted ground planes, wherein the plurality of ground posts coupled to the plurality of the shorted ground planes creates a plurality of shorted ground posts, and wherein the package lid coupled to the plurality of shorted ground posts creates a shorted package lid.

12. The package of claim 1, wherein the plurality of ground posts comprises an electrically conductive epoxy.

13. The package of claim 1, wherein one or more of the plurality of ground planes protrudes from the first surface of the substrate.

14. A method of assembling an integrated circuit (IC) device package, comprising:
- forming a substrate having a plurality of ground planes disposed in the substrate;
- attaching at least one IC die to a first surface of the substrate;
- disposing a plurality of ground posts on the first surface of the substrate;
- directly coupling at least two ground planes of the plurality of ground planes disposed in the substrate to each other via a ground post of the plurality of ground posts, the ground post being spaced apart from the first surface of the substrate; and
- coupling a package lid to the plurality of ground posts.

15. The method of claim 14, further comprising:
- opening a plurality of substrate openings that expose each of the plurality of ground planes;
- flowing a thermally and electrically conductive material into each of the plurality of substrate openings; and
- coupling the plurality of ground posts to the plurality of ground planes by the thermally and electrically conductive material in each substrate opening of the plurality of substrate openings.

16. The method of claim 15, wherein the thermally and electrically conductive material is an electrically conductive epoxy.

17. The method of claim 14, wherein the disposing of the plurality of ground posts comprises:
- disposing each of the plurality of ground posts positioned around a perimeter of the substrate and spaced apart a maximum distance of one-tenth of a wavelength of EMI interference generated by the IC device package.

18. The method of claim 14, further comprising:
- shorting each of the plurality of ground planes to each other to create a plurality of shorted ground planes;
- shorting each of the plurality of ground posts to the plurality of shorted ground planes to create a plurality of shorted ground posts; and
- shorting the package lid to the plurality of shorted ground posts to create a shorted protective lid.

19. The method of claim 18, further comprising:
- shorting, in the printed circuit board, each of the the plurality of ground planes to each other to create the plurality of shorted ground planes.

20. The method of claim 14, wherein the forming of the substrate comprises:
- isolating the plurality of ground planes located in the substrate.

21. The method of claim 14, wherein the forming of the substrate comprises:
- grouping a first set of ground planes of the plurality of ground planes separate from a second set of ground planes of the plurality of ground planes.

22. The method of claim 14, further comprising:
- mounting a printed circuit board to a second surface of the substrate.

23. An integrated circuit (IC) device package, comprising:
- an IC die;
- a plurality of ground posts;
- a package lid coupled to the plurality of ground posts; and
- a substrate having opposing first and second surfaces, the substrate including a plurality of ground planes disposed in the substrate;
- wherein the IC die is attached to the first surface of the substrate;
- wherein the plurality of ground posts are disposed on the first surface of the substrate, and at least two ground planes of the plurality of ground planes disposed in the substrate are coupled to each other via a ground post of the plurality of ground posts; and
- wherein a first surface of the ground post of the plurality of ground posts contacts the at least two ground planes of the plurality of ground planes, the first surface of the ground post being spaced apart from the first surface of the substrate.

24. The package of claim 23, wherein the at least two ground planes of the plurality of ground planes are coupled to each other via the first surface of the ground post of the plurality of ground posts.

25. The package of claim 23, wherein the first surface of the ground post of the plurality of ground posts directly contacts the at least two ground planes of the plurality of ground planes.

* * * * *

UNITED STATES PATENT AND TRADEMARK OFFICE
CERTIFICATE OF CORRECTION

PATENT NO. : 8,669,646 B2  
APPLICATION NO. : 13/149793  
DATED : March 11, 2014  
INVENTOR(S) : Tabatabai et al.

Page 1 of 1

It is certified that error appears in the above-identified patent and that said Letters Patent is hereby corrected as shown below:

On the Title Page, Item listing the Primary Examiner, replace "Dao H. Hguyen" with --Dao H. Nguyen--.
On the Title Page, in Item (57), Abstract, replace "protective lid from an enclosure structure" with --protective lid form an enclosure structure--.
On the Title Page, in Item (57), Abstract, replace "shields EMI from and radiating" with --shields EMI from radiating--.

In the Claims
Column 16, lines 2-3, replace "each of the the plurality" with --each of the plurality--.

Signed and Sealed this
Third Day of June, 2014

Michelle K. Lee
*Deputy Director of the United States Patent and Trademark Office*